(12) United States Patent
Kruglick

(10) Patent No.: US 8,178,011 B2
(45) Date of Patent: May 15, 2012

(54) SELF-ASSEMBLED NANO-LITHOGRAPHIC IMPRINT MASKS

(75) Inventor: Ezekiel Kruglick, Poway, CA (US)

(73) Assignee: Empire Technology Development LLC, Wilmington, DE (US)

( * ) Notice: Subject to any disclaimer, the term of this patent is extended or adjusted under 35 U.S.C. 154(b) by 224 days.

(21) Appl. No.: 12/511,457

(22) Filed: Jul. 29, 2009

(65) Prior Publication Data
US 2011/0024950 A1  Feb. 3, 2011

(51) Int. Cl.
  *B05D 5/02* (2006.01)
  *G03G 7/00* (2006.01)
  *C08F 2/46* (2006.01)
  *C03C 25/68* (2006.01)

(52) U.S. Cl. ......... 264/2.5; 264/219; 264/496; 425/385; 425/394; 425/174.4

(58) Field of Classification Search .................. 264/319, 264/2.5, 219, 496; 425/174.4, 385, 394; 977/887
See application file for complete search history.

(56) References Cited

U.S. PATENT DOCUMENTS

| | | | | |
|---|---|---|---|---|
| 6,814,897 | B2 * | 11/2004 | Morita | 264/1.33 |
| 6,971,116 | B2 * | 11/2005 | Takeda et al. | 720/718 |
| 7,150,844 | B2 * | 12/2006 | Deeman et al. | 264/220 |
| 7,704,425 | B2 | 4/2010 | Heidari et al. | |
| 7,842,337 | B2 | 11/2010 | Kim et al. | |
| 7,919,029 | B2 * | 4/2011 | Gauzner et al. | 264/225 |
| 2002/0153625 | A1 * | 10/2002 | Katsumura et al. | 264/1.36 |
| 2005/0161842 | A1 * | 7/2005 | Kai et al. | 264/1.33 |
| 2007/0212522 | A1 | 9/2007 | Heidari et al. | |
| 2007/0278704 | A1 * | 12/2007 | Meinders | 264/2.5 |
| 2009/0004375 | A1 | 1/2009 | Kim et al. | |
| 2009/0032987 | A1 * | 2/2009 | Boettiger | 264/1.36 |
| 2009/0122310 | A1 * | 5/2009 | Zhang et al. | 356/301 |
| 2009/0278269 | A1 * | 11/2009 | Chuang | 264/2.5 |
| 2009/0308837 | A1 * | 12/2009 | Albrecht et al. | 216/22 |
| 2010/0102415 | A1 * | 4/2010 | Millward et al. | 257/506 |
| 2010/0130005 | A1 * | 5/2010 | Lee et al. | 438/652 |
| 2010/0316849 | A1 * | 12/2010 | Millward et al. | 428/195.1 |

FOREIGN PATENT DOCUMENTS

| | | |
|---|---|---|
| KR | 20060128749 A | 12/2006 |
| KR | 20090001371 A | 1/2009 |

OTHER PUBLICATIONS

Deegan, Robert D. et al., "Contact Line Deposits in an Evaporating Drop," Physical Review E, vol. 62, No. 1, The American Physical Society, Jul. 2000, pp. 756-765.

(Continued)

*Primary Examiner* — Joseph Del Sole
*Assistant Examiner* — Nahida Sultana
(74) *Attorney, Agent, or Firm* — Dorsey & Whitney LLP

(57) ABSTRACT

The present disclosure relates to techniques for replicating large-scale nano-pattern structures using a block copolymer structure as a mask in a replication process. Example methods may include performing self-assembling block copolymer reactions to create large self-assembling nano-structures. The nano-structures may then be replicated by using the large self-assembling nano-structure as a mask in nano-imprint lithography.

17 Claims, 8 Drawing Sheets

OTHER PUBLICATIONS

Yabu, Hiroshi, et al., "Preparation of Self-Organized Mesoscale Polymer Patterns on a Solid Substrate: Continuous Pattern Formation from a Receding Meniscus," Advanced Functional Materials, vol. 15, No. 4, Wiley-VCH Verlag GmbH & Co. KGaA, Weinheim, Apr. 2005, pp. 575-581.

Kim, B.H., et al., "Hierarchical Self-Assembly of Block Copolymers for Lithography-Free Nanopatterning," Advanced Materials, vol. 20, Issue 12, Wiley-VCH Verlag GmbH & Co. KGaA, Weinheim, 2008, pp. 2303-2307.

Wei Wu et al., "Midinfrared Metamaterials Fabricated by Nanoimprint Lithography," Applied Physics Letters, vol. 90, Issue 6, American Institute of Physics, 2007, pp. 1-3.

* cited by examiner

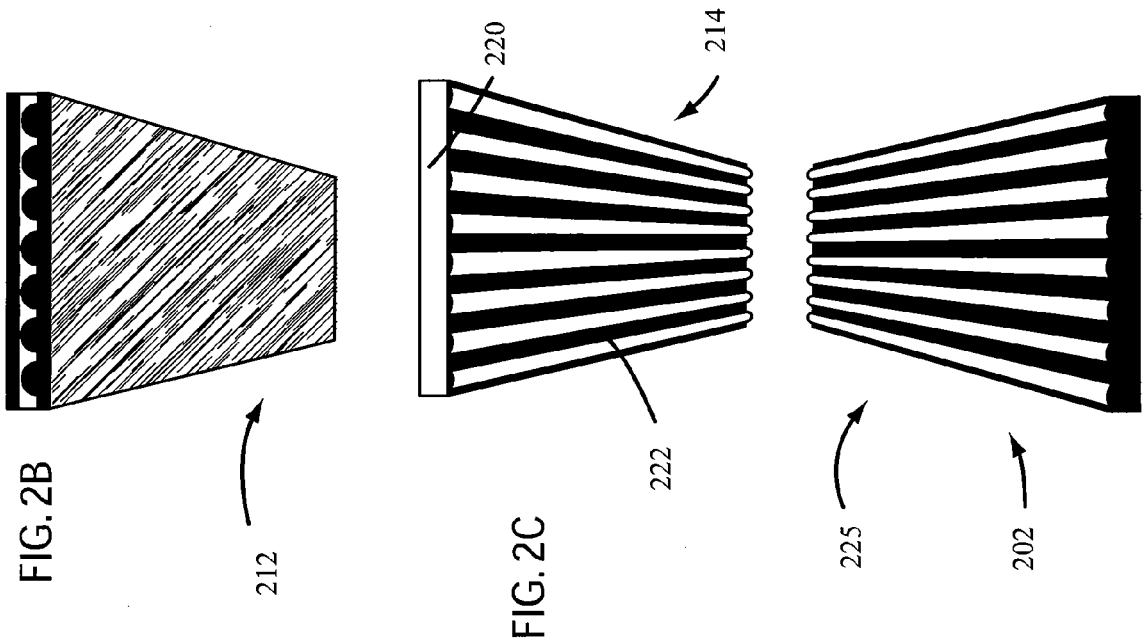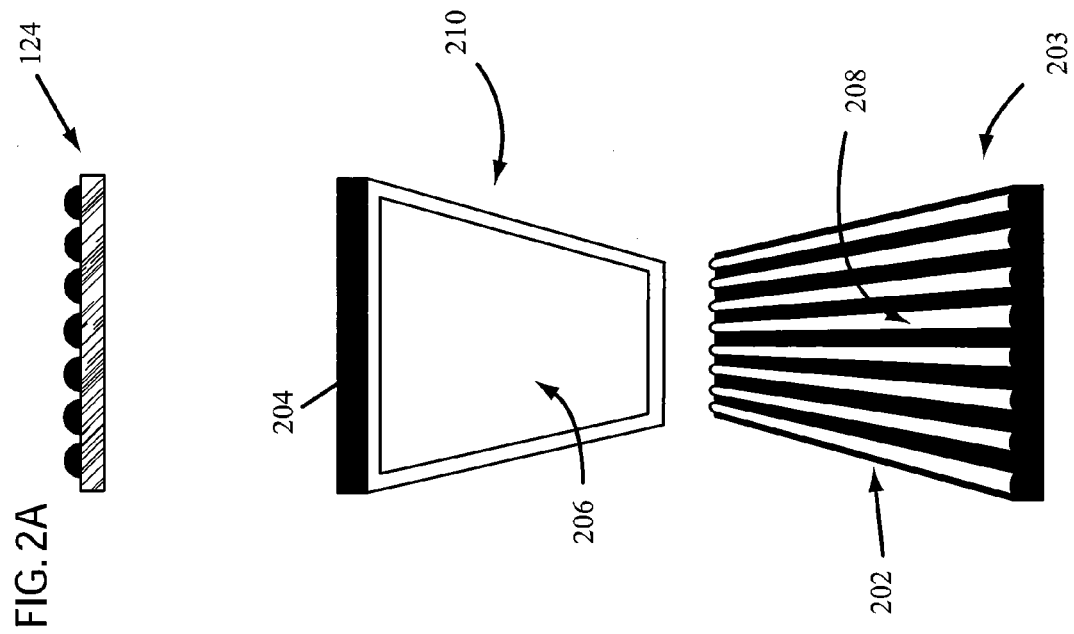

US 8,178,011 B2

SELF-ASSEMBLED NANO-LITHOGRAPHIC IMPRINT MASKS

BACKGROUND

Nano-imprint lithography (NIL) may be used to create structures containing nanometer scale patterns that have been used in, for instance, electrical, optical, photonic, and biological devices. NIL forms surface nano-structures by mechanical deformation of the patterning material. Generally, NIL involves creating a mask with topological nano-patterns, which is pressed against a substrate coated with a layer of imprint resist, or patterning material. The mask/resist/substrate combination is cured. The mask is then removed from the substrate, leaving an imprint on the resist of the nano-patterns contained on the mold. A pattern transfer process may then be performed to transfer the pattern in the resist to the substrate underneath.

BRIEF DESCRIPTION OF THE FIGURES

The foregoing and other features of the present disclosure will become more fully apparent form the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings, in which:

FIG. 2a illustrates using the self assembled block copolymer structure as a mask in a nano-imprint lithography process, in accordance with some examples;

FIG. 2b illustrates pressing the mask against an imprint resist coated substrate to create a temporary combined unit, in accordance with some examples;

FIG. 2c illustrates fabrication of a negative-imprint replica of the original copolymer mask after curing, in accordance with some examples;

DETAILED DESCRIPTION

Figure 1A:
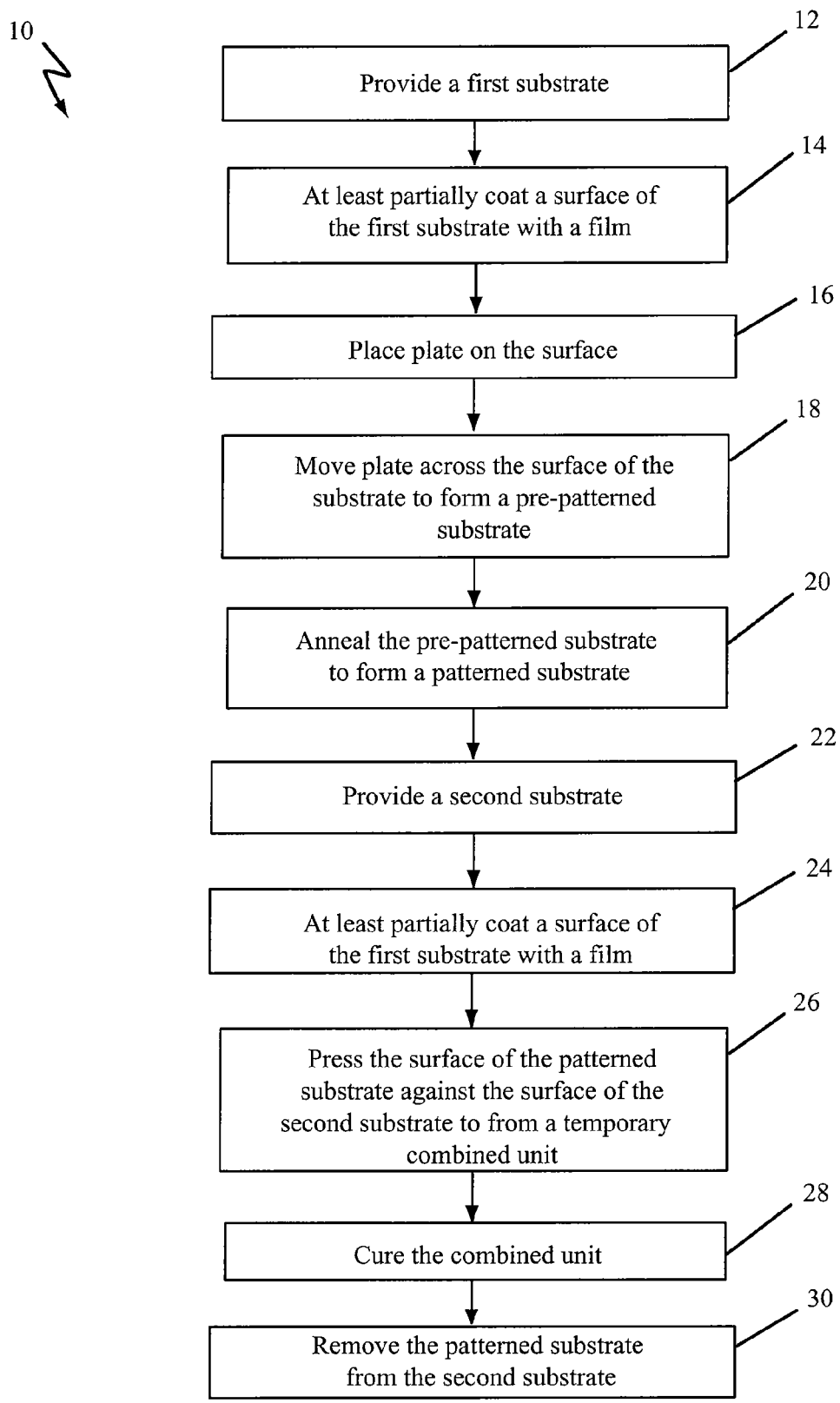
FIG. 1a is a flow diagram illustrating a method of preparing a mask and using the mask in a replication process to create arbitrarily large-scale nano-pattern structures in accordance with some examples.

In the examples below, the following reference numerals are used: a method for preparing a mask and replicating large-scale nano-pattern structures using the mask 10, including one or more of operations 12-30. An at least partially coated substrate with a plate being moved across it to generate self-organizing micro-patterns in the 100, including one or more of a substrate 102, a block copolymer film solution 104, a plate 106, an area of greater thickness in a self-organized micro-pattern 108, an area of lesser thickness in self-organized micro-pattern 110. A self-organized micro-pattern structure 114, including one or more of a self-organized micro-pattern 112 and a block copolymer structure after micro-patterning 114. A self assembled copolymer structure, created after annealing the substrate coated with a block copolymer film with self-organizing micro-patterns 124, including one or more of a hierarchical nano-pattern produced after annealing 116, well-aligned lamellae in the hierarchical nano-pattern 118, randomly-aligned lamellae in the hierarchical nano-pattern 120, and a distinct boundary between well-aligned and randomly aligned lamellae 122. The self assembled copolymer structure used as a mask in a nano-imprint lithography process 203, including one or more of a mask used in nano-imprint lithography 202, a substrate used in nano-imprint lithography 204, an imprint resist material used in nano-imprint lithography 206, a nano-patterning on mask used in nano-imprint lithography 208, an imprint resist coated substrate 210. A temporary combined unit (mask pressed against imprint resist coated substrate) 212. A negative-imprint replica of the original block copolymer mask after curing 225, including one or more of an imprint sample, which is the imprint resist coated substrate after mechanical deformation imprints the mask pattern onto the imprint resist material 214, a substrate of imprint sample 220, and a pattern on resist of imprint sample 222. A method for creating positive image replicas of an original block copolymer nano-patterned mask through another iteration of nano-imprint lithography 50, including one or more of operations 52-62. The structures associated with methods provided herein 301 including fabrication of a resist with a negative imprint of the pattern on the copolymer structure mask 305. Replication by nano-imprint lithography of nano-structures having a positive pattern image of an original self assembled copolymer structure 302, including an imprint resist coated substrate 310 used in a second round of nano-imprint lithography, and a resist with a positive imprint of the pattern on the copolymer structure mask 320 created after annealing 322. Replication, by roll-to-roll nano-imprint lithography, of nano-structure webs having a positive pattern image of an original self assembled copolymer structure 401 including a substrate that has the block copolymer structure pattern etched onto it and used in a mask in nano-imprint lithography 405, imprint resist on a substrate for use in roll-to-roll nano-imprint lithography 407, a resist with a negative image pattern of a substrate mask etched from copolymer structure and used as a mask in further roll-to-roll nano-imprint lithography process 410, roll-to-roll nano-imprint lithography process 412, and web created after roll-to-roll nano-imprint lithography process that has nano-patterns which are a positive image pattern of the substrate mask etched from the copolymer structure 414. A method for replicating large-scale nano-pattern structures 500 including operations 502-504. A method for replicating positive image imprints of large-scale nano-pattern structures 600 including operations 602-606.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, may be arranged, substituted, combined, separated, and designed in a wide variety of different configurations, all of which are explicitly contemplated herein.

Nano-imprint lithography is a method of replicating nano-patterns comprising nanometer scale structures. Fabricating nanometer scale structures with NIL may be generally low cost, have high throughput, and high resolution. In nano-imprint lithography (NIL), a mask, also known as a mold, template, or stamp, is created that has topographical nano-patterns. The mask may be used to imprint the nano-patterns contained on the mask onto a substrate coated with a layer of imprint resist. A single mask used in NIL may typically be used to create a plurality of replicas. That is, each mask is typically reusable.

Commonly, a mask used for imprinting in NIL may be made by electron beam lithography (EBL). EBL is a method for fabricating nano-structures in a resist that may be transferred to another material for use in other devices or technologies. In EBL, a surface covered with a resist (or film) may be scanned by a beam of electrons in a patterned manner, referred to as "exposing the resist." Next, either exposed, or non-exposed areas of the resist are removed, which is referred to as "developing." Developing creates the nano-structures on the resist. The resist, with developed nano-structures, may then be used to imprint other surfaces. Using EBL to create a mask, however, may limit the size of the mask to a few inches per side. Further, creating a mask by EBL may take a relatively long time because it takes a long time to expose an entire substrate.

By using a self-assembling hierarchical chemical reaction to create masks, less costly masks may be produced more quickly. Further, using self-assembling hierarchical chemical reactions to produce masks for use in NIL may allow for the production of arbitrarily large-scale nano-patterns with complex patterns that may be used in, for example, nano-solar surface roughening, nano-fluidics, surface property control, display diffusing, or optics.

According to methods taught herein, various nano-scale designs may be achieved predictably. Nano-structures, for instance, individual dots, or lines, may be approximately on the order of a nanometer. Nano-patterns, specific patterns made up of individual dots, lines, or other morphologies, for instance, may be approximately in the sub-10-nanometer range. Substrates containing one or more nano-patterns (including repetitions of a single nano-pattern), suitable for use in single wafer NIL, may be approximately greater than 2-4 inches, or approximately 8 inches. Generally, a large-scale nano-pattern structure may be a substrate suitable for single wafer NIL, for example, including nano-patterns of nano-structures in the ranges discussed above. In alternative examples, other dimensions of substrates, nano-structures, and nano-patterns may be used.

FIG. 1a is a flow diagram illustrating a method 10 of preparing a mask and using the mask in a replication process to create arbitrarily large-scale nano-pattern structures in accordance with various examples discussed herein. While discussion is made herein to a method of creating or replicating large-scale nano-pattern structures, it is to be appreciated that the nano-pattern structures may be replicated on any suitable size and, thus, is not limited to large-scales. As shown, the method 10 may include providing one or more of a first substrate at operation 12, at least partially coating a surface of the first substrate with a film at operation 14, placing a plate on the surface of the substrate at operation 16, moving the plate across the surface of the substrate to form a pre-patterned substrate at operation 18, and annealing the pre-patterned substrate to form a patterned substrate at operation 20. The patterned substrate may be used as a mask in a lithography process on a second substrate. Thus, the method 10 may further include providing a second substrate at operation 22, at least partially coating the second substrate with a film or material at operation 24, pressing the patterned substrate (or mask) against the second substrate to create a temporary combined unit at operation 26, curing the combined unit at operation 28, and removing the patterned substrate from the second substrate at operation 30. A patterned second substrate may thus be formed. The size of the second substrate is not substantially limited, and the example method 10 may be used to pattern arbitrarily large-scale structures.

In specific examples, the first substrate may be any suitable material for receiving a film for block copolymer self-assembling. In some implementations, a surface of the first substrate may be prepared to enhance suitability for receiving a film, such as by increasing hydrophilic properties of the substrate. The film used to at least partially coat the first substrate may be a block copolymer film. Moving the plate across the substrate, such as by sliding a glass plate across the copolymer film coated on the substrate, may create self-organizing micro-patterns in the film. The micro-patterns thus form a pattern that may be further patterned to form additional hierarchical patterning when annealed, such that the processed first substrate may be considered a mask that may be used, for example, in NIL. Accordingly, the second substrate may generally comprise any material for which micro-patterning is desirable. Great flexibility in choosing a substrate material may be possible. Common substrate materials may include, for example, silicon, nickel, glass, quartz, or silicon dioxide, or any other material that may be useful for NIL. The film used to at least partially coat the second substrate may be, for example, an imprint resist material for use in NIL.

Generally, block copolymer reactions are used to create a block copolymer structure that has a pattern in the resist that exhibits spontaneous alignment of nano-scale morphology. This created structure is referred to herein as a "block copolymer structure" or "the patterned substrate." In accordance with examples provided herein, the block copolymer structure may then be used as a mask in a nano-imprint lithography process to fabricate additional patterned substrates which replicate the nano-patterns contained on the block copolymer structure.

Figure 1B:
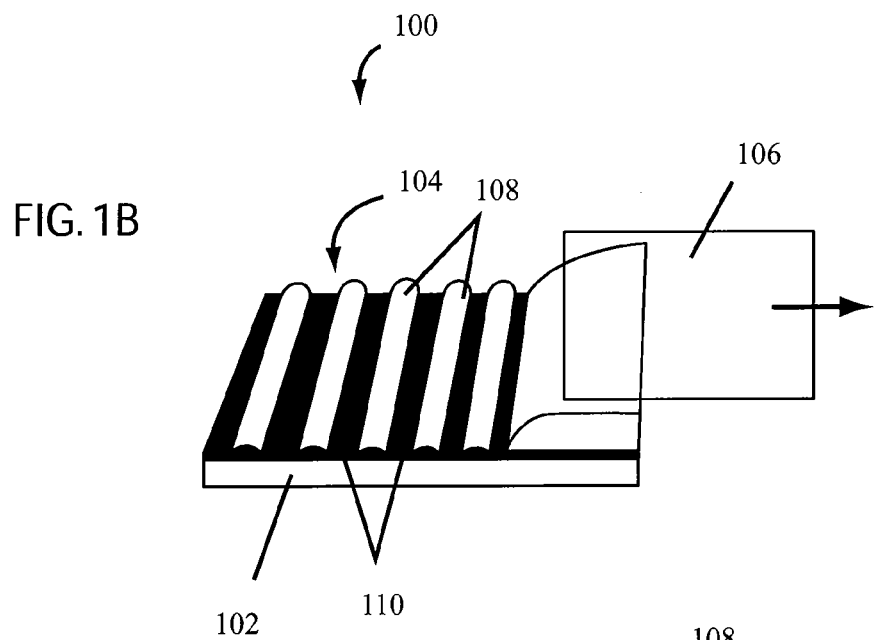
FIG. 1b illustrates an at least partially coated substrate with a plate being moved across it to generate self-organizing micro-patterns, in accordance with some examples.
Figure 1C:
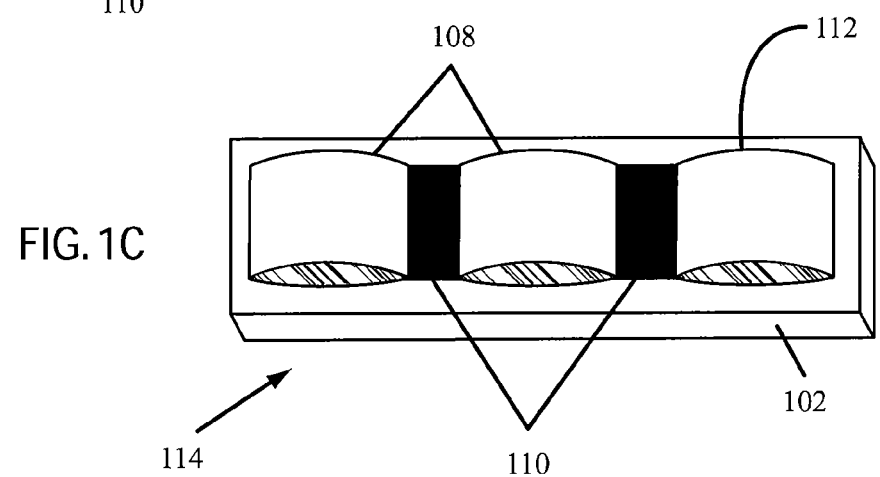
FIG. 1c illustrates a top view of a self-organized micro-pattern exhibiting periodic thickness variation created after drawing a plate across a substrate at least partially coated with a block copolymer solution, in accordance with some examples.
Figure 1D:
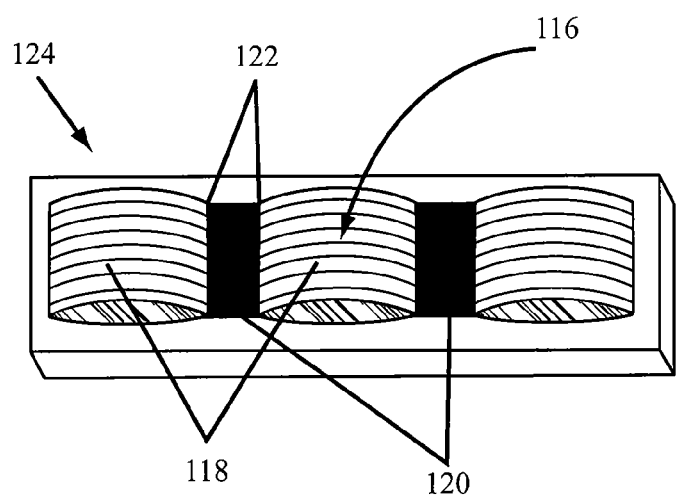
FIG. 1d illustrates fabrication of a self assembled block copolymer structure created after annealing a substrate pre-patterned with self-organizing micro-patterns, where the nano-patterning comprises alternating well-aligned micro-scale stripes and randomly aligned lamellae with a generally distinct boundary between the stripes and the lamellae in accordance with some examples.

Accordingly, hierarchical self-assembling block copolymer processes may be used to create a patterned substrate comprising nano-structures as described with respect to operations 14-20 of method 10 of FIG. 1a. FIGS. 1b-1d illustrate the structures associated with the method 10.

As shown in FIG. 1a, a substrate may be at least partially coated with a film such as a block copolymer film. As may be appreciated in light of the present disclosure, a thin film may be subject to strong boundary conditions from the substrate surface and the air-polymer interface. Because block copolymer assembly may be dependent on surface energetics, these boundaries may affect the orientation of nanoscopic polymer domains. The wetting characteristics of the substrate may be influenced by its composition, hydrophobicity or hydrophilicity, charge, or by a surface treatment such as modification with a surface-active polymer. Accordingly, the material of the substrate and any treatment of the material for the substrate may be selected to influence orientation of patterns formed thereon. Any substrate suitable for receiving a film may be used. In some examples, silicon, silicon dioxide (glass and quartz), polymers, or other materials may be used.

A surface of the substrate may be at least partially coated with a thin film. Any suitable method for coating the substrate, including, for example, drop casting, dip coating, spin coating, wiping, or other, may be used. FIG. 1b illustrates an at least partially coated substrate with a plate being moved across it to generate self-organizing micro-patterns, in accordance with some examples. In the example of FIG. 1b, a thin film of a block copolymer solution 104 is wiped onto a surface of the substrate 102.

Copolymers result from the chemical integration of two or more monomer units into random, alternating, or graft architecture chains. A block copolymer may be comprised of alternating segments of polymer chains synthesized using polymerization. Such polymers comprise a polymer chain comprised of chemically connected, mutually immiscible or incompatible segments or blocks. Such polymers may undergo microphase separation. Due to physical connectivity of the blocks, they may not form large phase-separated domains, so instead the individual segments self-organize into domains with nano-scale dimensions. At certain chain lengths and volume fractions, the self-organized structures may have well defined two- and three-dimensional periodicity including, for example, ordered spheres, cylinders, lamellae, and bicontinuous structures resulting from the minimization of surface free energies. Generally, the length scale of the separated domains and the architecture they adopt may depend on the molecular weight, composition, interactions, and architecture of the segments and on the nature of any co-assembled additives. The self-assembly and structural organization of a microphase-separated block copolymer may also be influenced by electric fields, shearing forces, surface control of wetability, chemical attachment to surfaces, epitaxial self-assembly on nano-patterned substrates, spatial confinement by surface relief patterns in substrates and molds, and voids in a range of porous hosts.

Accordingly, the block copolymer solution generally is a solution that creates hierarchical self assembling nano-patterns. Any suitable block copolymer solution may be used and the specific solution used may be selected based on desired self-assembly morphology. In some examples, the block copolymer solution may be polystyrene-block-poly(methyl methacrylate) (PS-b-PMMA) dissolved in toluene. It should be recognized in light of the present disclosure that in addition to polystyrene solutions, electrically conducting polymers, and liquid crystalline polymers, for example, when used in solution may also be suitable for creating self-assembling nano-patterns. Other solutions may also be used.

The surface of the substrate coated with the thin film then may be covered with a plate 106. Generally, the plate 106 may be formed of any material that may be moved across the film covered substrate, such as plastic, metal or glass for example. In one example, glass is used. The block copolymer film 104 may be generally sandwiched between the substrate 102 and the plate 106. The plate 106 may then be moved across the substrate 102, as shown in FIG. 1b. Generally, the plate may be mechanically drawn across the block copolymer film-coated surface of the substrate using any known movement apparatus. In some examples, the drawing of the plate across the substrate may be done at a constant velocity to ensure an even periodic thickness variation in the block copolymer film, for example at a velocity between approximately 2 and approximately 40 $\mu m\ s^{-1}$. Moving the plate 106 across the surface substrate 102 coated with the block copolymer solution 104, as shown in FIG. 1b, causes the solution to self-organize into a micro-pattern. The block copolymer film 104 self-organizes at the receding edge of the plate due to the evaporation of toluene (or similar material) at the solution front. As the toluene evaporates, a residue of the copolymer is left at the edge of the block copolymer solution. This residue temporarily slows the movement of the solution edge in a manner that periodically varies the receding velocity of the solution edge, creating periodic areas of greater thickness 108 and lesser thickness 110 in the copolymer film solution 104. FIG. 1c shows a top view of the self-organized micro-pattern 112 exhibiting periodic thickness variation 108, 110 created after drawing the plate 106 across the block copolymer solution 104.

As discussed, various factors may be used to influence morphology of the block copolymer self-organization. Generally, the block copolymer film may lead to periodic, predictable morphologies. Selection of factors including what factors to alter and the levels of such factors may influence these morphologies. For example, the sliding speed of the plate 106 across the surface of the substrate 102 coated with the block copolymer solution 104 may influence the morphology of the self-organization and the geometry of the micro-patterning. The sliding speed of the plate over the block copolymer film-coated substrate, and the concentration of the block copolymer in the block copolymer film may be selected to achieve different types of nano-patterns on the block copolymer, such as dots, stripes and ladders. Nano-dots may be formed in a polystyrene solution with an approximate concentration of 0.1 $gL^{-1}$, for example, at an approximate sliding speed of 50 $\mu m\ s^{-1}$. Periodic stripes may form at a higher concentration of approximately 0.5 $gL^{-1}$. At a still higher concentration of approximately 4.0 $gL^{-1}$, uniform ladder-type patterns may emerge. Similarly, sliding speed may affect the spacing of the stripes 108. As the sliding speed is increased, the spacing of the stripes may decrease initially, but then may increase with increases in sliding speed. Accordingly, periodicity of the nano-structures in the nano-patterns may be varied predictably.

Systems for creating a mask, or a patterned substrate, are provided herein. Such systems may include substrate holders, movement apparatuses, a coating apparatus, and a processor. In some examples, the substrate holders and the movement apparatuses may be integrally formed as moving substrate holders. A plate may be attached to one of the substrate holders. The plate may be moved at a speed that may be set by a computer-controlled driving system. In some examples, a second plate may be attached to the other substrate holder. The two plates may overlap, such as by approximately 3-4 cm, and be separated by a distance of approximately 180-220 $\mu m$ in order to permit application of a copolymer film between the substrate and the plate. It should be recognized that the second substrate holder may hold a substrate of various types and that the second substrate may comprise a different material, shape, and/or size from the first substrate. In some examples, systems for implementing methods as described herein may further include a computer system to control the speed at which the plate, or plates in some examples, moves across the substrate. A coating apparatus, such as a mechanized brush, a dipping apparatus, or other, may be provided for at least partially coating a surface of the substrate. A microscope system may be provided to observe the self-organizing micro-patterning.

Moving the plate across the surface of the substrate coated with a block copolymer film creates a pre-patterned substrate. The pre-patterned substrate may be annealed at a high temperature, such as between approximately 170° C. and approximately 210° C., or for example at 190° C. Annealing the block copolymer structure 114 results in specific hierarchical nano-patterning 116. For example, the nano-patterning may comprise alternating well-aligned microscale stripes 118, and randomly aligned lamellae 120, with a generally distinct boundary 122 between the stripes 118 and the lamellae 120, as shown in FIG. 1d. Generally, as shown in FIG. 1d, the well-aligned lamellae 118 occur at the thick part 108 of the block copolymer film 104 created during the self-organizing micro-patterning process shown in FIGS. 1b and 1c. In some examples, the block copolymer structures may be washed with solvents to enhance the topography of the nano-patterns.

Accordingly, once annealed, a patterned substrate 124 comprising, for example, a large nano-patterned structure 116, is provided. The resulting patterned substrate 124 may be used directly in various nano-applications. Alternatively, the resulting patterned substrate may be used as a mask in a NIL process as described in operations 22-30 of FIG. 1a. In full wafer nano-imprint lithography, all the patterns for imprinting on the substrate are contained in a single nano-imprint field and are transferred in a single imprint operation. This allows a high throughput and uniformity but requires a relatively large sized mask, which may be costly when manufactured by, for example, EBL. Using the block copolymer patterned substrate as a mask in a NIL process may allow for less costly replication of structures containing large-scale nano-patterns.

Nano-imprint lithography has many possibilities for nano-technological implementation due to its ability to make nanometer scale patterns reliably and inexpensively. Generally, NIL involves using a nano-patterned mask to create patterns in an imprint resist through mechanical deformation. The imprint resist substance may be cured during imprinting with heat (thermal NIL) or ultraviolet light (photo or UV NIL) for example, in addition to other methods, such as electro-chemical nano-imprinting, which are understood in light of the present disclosure.

FIG. 2a illustrates using the self assembled block copolymer structure as a mask in a nano-imprint lithography process, in accordance with some examples. As shown in FIG. 2a, there are generally three components used in an NIL process: a mask 202, also known as a template, mold or stamp; a substrate 204; and an imprint resist material 206. A thin layer or film of imprint resist material 206 may be applied to the substrate 204 as described in operation 24 of FIG. 1a. The imprint material 206 may be any suitable material for mechanical deformation by a mask. In some examples, the imprint resist material may be a monomer or polymer formulation that may be cured by heat or UV light during imprinting. The layer of imprint resist material 206 may be applied, for example by spin-coating, which is a process for applying generally uniform thin films to generally flat substrates. Using spin-coating, an excess of solution is placed on a surface of the substrate, and then the substrate is rotated at high speeds, by a spin-coater, in order to spread the fluid by centrifugal force. Alternatively, any known method of coating a surface of the substrate with a thin film may be used. FIG. 2b illustrates pressing the mask against an imprint resist coated substrate to create a temporary combined unit, in accordance with some examples. The patterned substrate 202 (also referred to as a mask) formed in operations 12-20, with topological nano-patterns 208 on it, may then be pressed against the coated substrate unit 210 as shown in FIG. 2b.

The patterned substrate or mask that is used to imprint the resist-coated substrate may be a block copolymer structure, shown in FIG. 1d. The patterned substrate is pressed against the surface of the second substrate that may be coated with an imprint resist film. Specifically, the surface of the patterned substrate having a pattern thereon may be pressed to the imprint resist film to form a temporary combined unit 212, shown in FIG. 2b. The temporary combined unit 212 may then be cured. In one example curing may be performed by heating the combined unit 212 above the glass transition temperature of the imprint resist material 206, and then cooling the combined unit 212. An imprint resist material may be chosen so that the curing temperature occurs at a convenient temperature, such as between 80° C. and 100° C. When the imprint resist material is heated past its glass transition temperature, the structures on the mask may be imprinted into the melt imprint resist material. The combined unit may be heated by any desired method that may achieve a heat above the glass transition temperature of the imprint resist material, such as an oven. Alternatively, the combined unit may be cured by UV light.

The second substrate, with imprint resist material coated thereon, may comprise an imprint sample 210. After pressing of the mask, or patterned substrate 202, thereto, the imprint sample 210 is imprinted with a negative imprint of the nano-pattern 208 on the mask 202. FIG. 2c illustrates fabrication of a negative-imprint replica of the original copolymer mask after curing, in accordance with some examples. The pattern that is replicated from the mask in an NIL process is a negative imprint of the mask, and may be referred to as a patterned structure 214, as can be seen in FIG. 2c. When the mask has a raised surface, a corresponding indented surface may result in the imprint resist material. Similarly, when the mask has an indented-like surface between two raised surfaces, the imprint resist may be imprinted with a raised surface. For this reason, the pattern that is imprinted onto the resist may be a negative imprint of the mask pattern. Adhesion between the resist and the template may be controlled to facilitate proper release. Generally, the patterned substrate 202, or mask, is durable and may be used multiple times to replicate the nano-patterns on it.

In some examples, a pattern transfer process, such as reactive ion etching (RIE), may be used to transfer the negative pattern imprinted on the resist 222 to the substrate 220 underneath.

Semiconductors may be used as a substrate 204 material for NIL processes, such as silicon, silicon dioxide (glass and quartz), polymers, and other materials. The imprint resist patterning media 206 may be a polymer, but it may also be, for example, a monomer, resins, silicon, or metal, etc. PMMA (poly methyl methacrylate) is one of the most common thermoplastic polymers used as an imprint resist material.

Using a block copolymer structure, created through the processes described herein, as a mask in an NIL process facilitates replication of large-scale complex patterns in a relatively inexpensive manner. The density and complexity of the patterns created through the block copolymer process, which may then be used as a mask in NIL, may be manipulated by altering the chemistry used to create them, as discussed above.

Figure 3A:
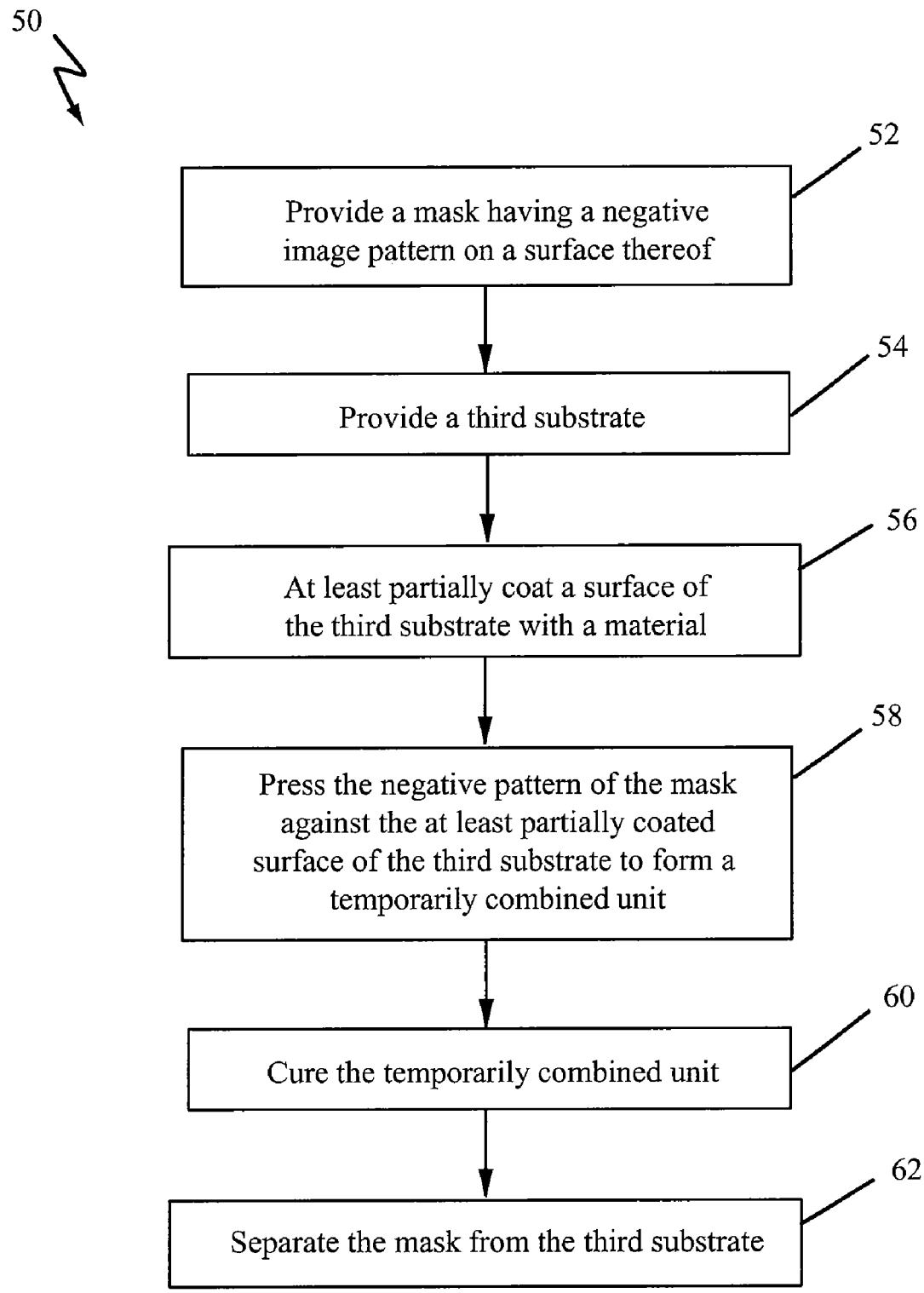
FIG. 3a illustrates a flow diagram of a method for creating arbitrarily large surfaces of positive nano-structures through another iteration of NIL, in accordance with some examples.

FIG. 3a illustrates a method 50 for creating arbitrarily large surfaces of positive nano-structures through another iteration of NIL. As shown, a mask with a negative pattern may be provided. In various examples, the mask may be formed using the process of FIG. 1a wherein the mask is the second substrate as patterned by the patterned substrate. The patterned substrate of FIG. 1a may generally comprise a positive pattern and, thus, when used as a mask to pattern a second substrate, may form a negative pattern on the second substrate. In accordance with examples discussed herein, the second substrate, patterned with a negative pattern, may thus be used as a mask to pattern a positive pattern on a third substrate. While the term "third substrate" may be used, it is to be appreciated that, in various examples, more or fewer than three substrates may be used and the reference to the substrate as the third substrate is not intended to be limiting.

Figure 3C:
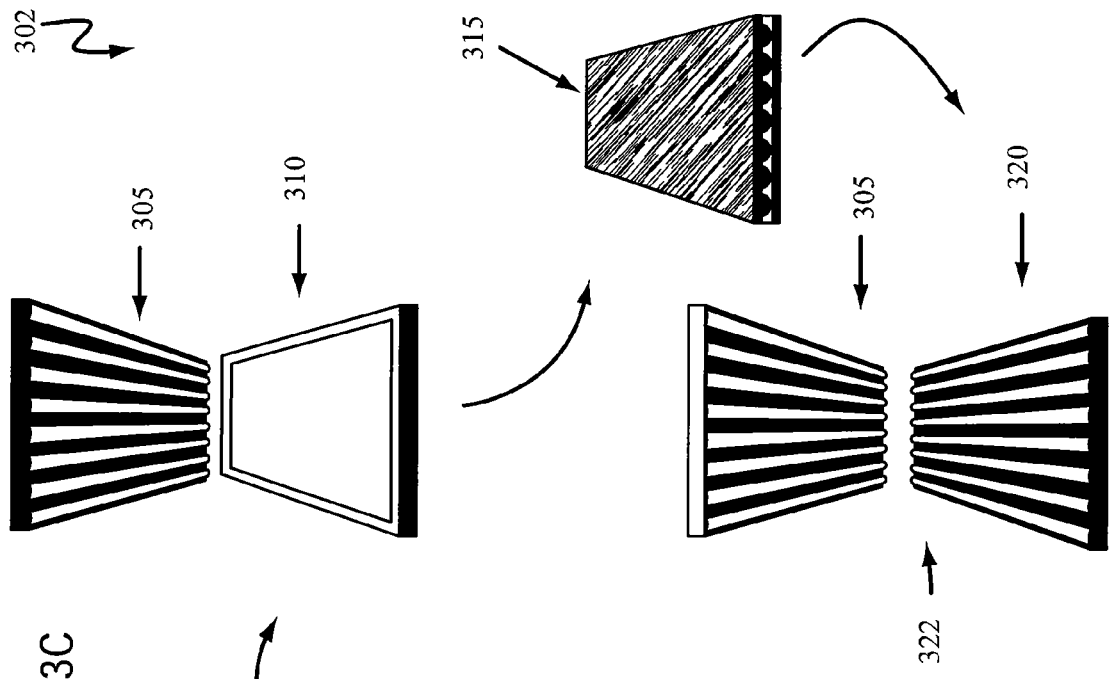
FIG. 3c illustrates a process flow for replication by nano-imprint lithography of nano-structures having a positive pattern image, in accordance with some examples.
Figure 3B:
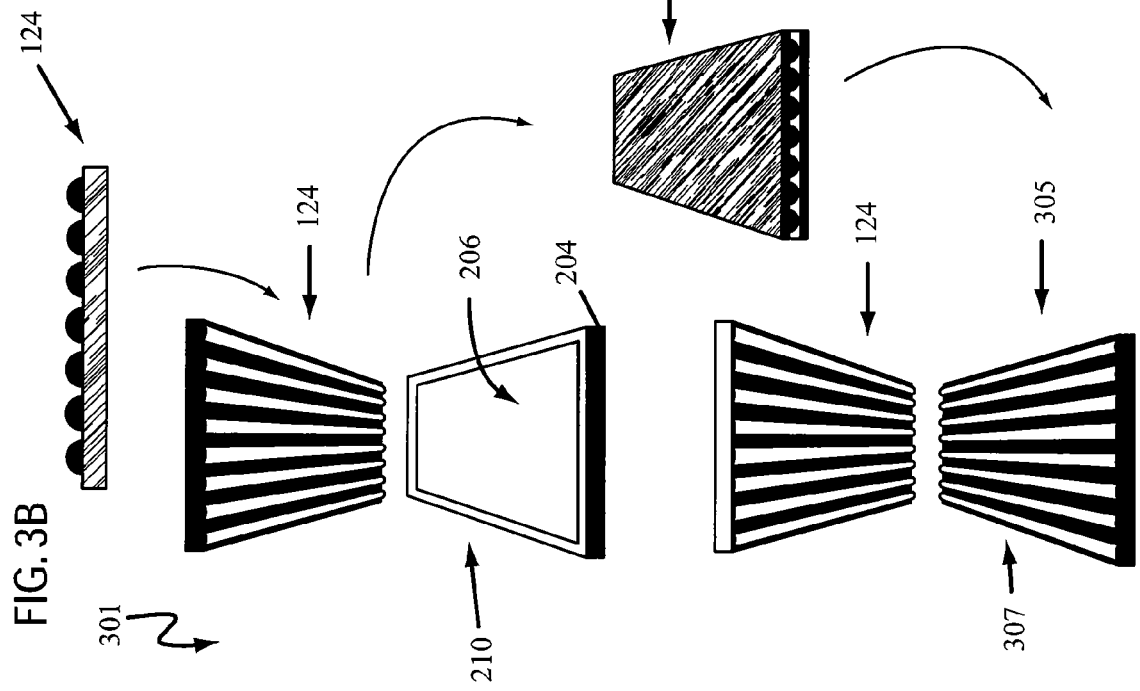
FIG. 3b, illustrates a process flow for fabrication of a mask with a negative imprint pattern, in accordance with some examples.

Accordingly, a mask formed using processes described herein may be used in an NIL process to imprint a target surface with a positive image of a negative pattern on the mask. FIGS. 3b and 3c illustrate the structures performing the operations of the method of FIG. 3a.

As shown in FIG. 3a, the method 50 may include one or more of providing a mask having a negative pattern at operation 52, providing a third substrate at operation 54, at least partially coating a surface of the third substrate with a material at operation 56, pressing the negative pattern of the mask against the at least partially coated surface of the third to form a temporarily combined unit at operation 58, curing the temporarily combined unit at operation 60, and separating the mask from the third substrate at operation 62.

The third substrate may be coated with an imprint resist material such that the third substrate may be imprinted using NIL. The size of the mask is not limited by factors that commonly limit mask fabrication and, an arbitrarily large patterned mask may be formed. Forming a negative pattern on the patterned substrate results in a positive pattern formed on the third substrate after NIL. Thus, using a relatively large negative patterned mask formed as discussed herein, a structure may be formed with a positive pattern in a single operation using full wafer nano-imprint lithography.

Accordingly, in some examples, two NIL processes may be performed to create a positive image in an imprint resist material on a substrate.

FIG. 3b is a process flow illustrating fabrication of a mask having a negative imprint pattern 305. The direction of flow begins with the block copolymer structure 124, which may be used as a mask 124 for an imprint resist 206 coated substrate 204. Next the mask 124 may be pressed into the resist 206 coated substrate 204, creating a temporary combined unit 126. Finally, the mask 124 may be pulled away from the substrate to reveal the creation of a structure with a negative imprint 305 of the original block copolymer mask 124. FIG. 3b illustrates the process flow of the first NIL process.

FIG. 3c illustrates a process flow for replication by nano-imprint lithography of nano-structures having a positive pattern image, in accordance with some examples. The second NIL process may use the negative-patterned substrate 305 created in the first NIL process as a mask 305 and a third resist-coated substrate 310. A surface of the third substrate may be at least partially coated with an imprint resist material 310, as illustrated in FIG. 3c. The mask created in the first NIL process 305 may be used to form a positive pattern of the negative image of the mask, which, in turn, is a negative image of the positive pattern of the original block copolymer structure of the patterned substrate. Thus, the mask 305 is pressed to the at least partially coated third substrate 310 to form a temporary combined unit 315. The temporary combined unit 315 may be cured and the mask 305 removed. The resultant positive image generally replicates the image provided on the patterned substrate 124. Accordingly, the second NIL process may create a positive image structure 320 of the original block copolymer structure 124.

In another example, the block copolymer pattern, created according to method 1, may be etched onto the substrate by reactive ion etching (RIE) for example to form a patterned substrate wafer. The patterned substrate wafer may then be used as a mask in NIL. The wafer may be formed of a material different from the first substrate. For example, the wafer may be formed of a silicon substrate. Accordingly, the material of the wafer may be chosen for suitability for other processes. For example, a silicon wafer may be substantially harder than a PMMA-based copolymer substrate as may be used for forming the block copolymer patterned substrate. A harder mask may be advantageous for patterning onto a PMMA target surface, for example.

The copolymer created structures may be suitable for surfaces that need pseudo-random nano-patterns with controlled parameters like pitch and density. Such patterns may be used in, for example, nano-solar surface roughening, nano-fluidics, surface property control, display diffusing, or optics.

In one example, the nano-structures produced by this method may be used to provide a diffuser function for flat panel LCD displays to increase the viewing angle. A roll-on NIL method may be used to produce nano-structures for this use and may create large enough surfaces of nano-structures for use on an LCD TV screen. The roll-on method of creating a web of nano-structures generally has increased throughput compared to standard methods. In a roll-on NIL process, a mask may be put on a roller and rolled onto a substrate covered with an imprint resist material.

Roll-on NIL may be cured thermally or by UV light. Roll-on NIL may permit replication of masks (or creation of webs) on the order of 8 inches and larger. In one embodiment, a roll-on UV NIL apparatus may comprise a transparent quartz cylinder that may be controlled by two synchronized motors. It should be recognized that the cylinder may be made of any suitable material such as metal, plastic or glass for example. Further, while two synchronized motors are described in this example, any number of motors may be used. A block copolymer patterning on a substrate may be created by performing operations 12-20 of FIG. 1a. The block copolymer substrate may be used as a first mask from which a flexible film mask can be created by using NIL by performing operations 24-30 of FIG. 1a. The flexible film mask may be made of any suitable substance, for instance PDMS (polydimethyl-siloxane), PET (Polyethylene terephthalate), or polycarbonate. The flexible film mask may create a negative imprint of the block copolymer patterning. The film mask may then be set-up on, for example, a transparent quartz cylinder in a roll-on NIL apparatus. The roll-on apparatus causes the patterning of the film mask to be transferred as a negative image onto a substrate with resist material. The substrate may be made of any material, such as, but not limited to, silicon or plastic. The resist may be any suitable material, such as a polymer, monomer, resin, silicon or metal. In the roll-on method, the imprinting process may be continuous via substrate feed motion under the imprinting pressure. After the imprinting process has been completed, the substrate with imprinted resist may be cured thermally, or by UV light for instance. In another embodiment, the UV light may be inside of the transparent roller, such that the substrate with resist is simultaneously imprinted and cured. A roll-on NIL method may also be used for creating, for example, larger rigid screen projection displays.

Figure 4:
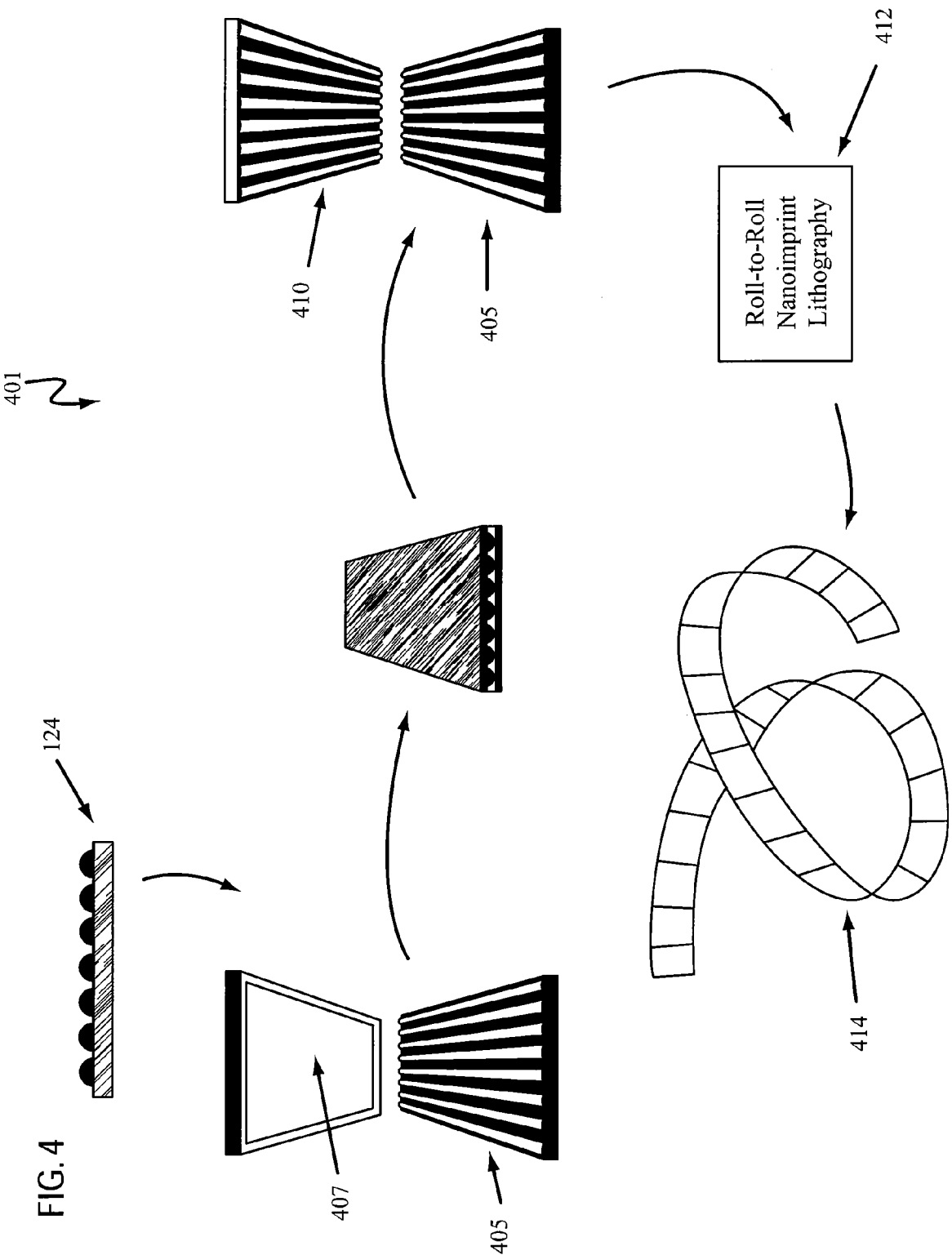
FIG. 4 illustrates a process flow for using roll-to-roll NIL using a block copolymer patterned substrate as a first mask, in accordance with some examples.

Additionally, for some applications a roll-to-roll NIL method of creating webs may be desired. FIG. 4 illustrates the process flow for using roll-to-roll NIL using a block copolymer patterned substrate as a first mask. The block copolymer patterning created by performing operations 12-20 of FIG. 1a may be etched onto a substrate wafer 405 by, for instance, reactive ion etching (RIE). The etched substrate wafer 405 may then be used as a mask to imprint a substrate coated with a particular resist 407, such as ethylene-tetrafluoroethylene (ETFE). The resulting ETFE negative-patterned substrate 410 may then be used as a mask in an additional roll-to-roll nano-imprint lithography process to create a positive-image web of nano-structures 414 that is complimentary to the block copolymer patterned substrate 124.

The substrate wafer 405 may comprise silicon or other suitable material. In a standard NIL process the silicon wafer 405 containing the patterning of the copolymer structure 124 may be used as a mask to pattern an imprint resist coated substrate 407. The imprint resist may be formed of any material as described with respect to other examples, Specifically for use in manufacturing an LCD TV screen, an imprint resist comprising ethylene-tetrafluoroethylene (ETFE) may be used. Accordingly, using the mask 405 may imprint a pattern into the ETFE imprint resist 407, thereby creating an ETFE structure 410. The ETFE structure 410 may then be used as a mask in the roll-to-roll NIL process 412. Specifically, in some examples, the ETFE mask may be wrapped and fixed to a stainless-steel roller. Liquid resist may be at least partially coated on the substrate. In some examples, such coating may be generally continuous. The resist and curing method used in the roll-to-roll process may be selected based on what roll-to-roll NIL speed is desired.

The resulting web 414 may be imprinted with structures that are positive images of the original copolymer structure 124. This is because the ETFE mask 410 is a negative image of the copolymer structure 124, and the ETFE mask 410 may be used to imprint the web 414 resulting from the roll-to-roll process 412. The above described method for fabricating a web of nano-structures may be used to create webs generally large enough to coat viewing screens, such as LCD screens.

In another example, the process described in the preceding example may be used to reduce or eliminate the impact of speckles on projection displays using laser light sources, particularly projection displays made of a flexible material. The size of the textures on the web may be large enough to eliminate speckle from laser-light sourced projection displays. Generally, laser light sources may be relatively pure, burn less power and be more efficient than other light sources. However, laser light may suffer from local constructive and destructive interference, known as speckles, which appear as variations in the coherence of the beam. If a television, for example, uses laser light as a light source, the image on the screen may appear to be "boiling" due to speckles. Applying a mesh consisting of self-assembling block copolymer structures replicated using NIL, or roll-to-roll NIL, to the projection screen may diffuse the speckle effect, thereby removing the effect.

Figure 5:
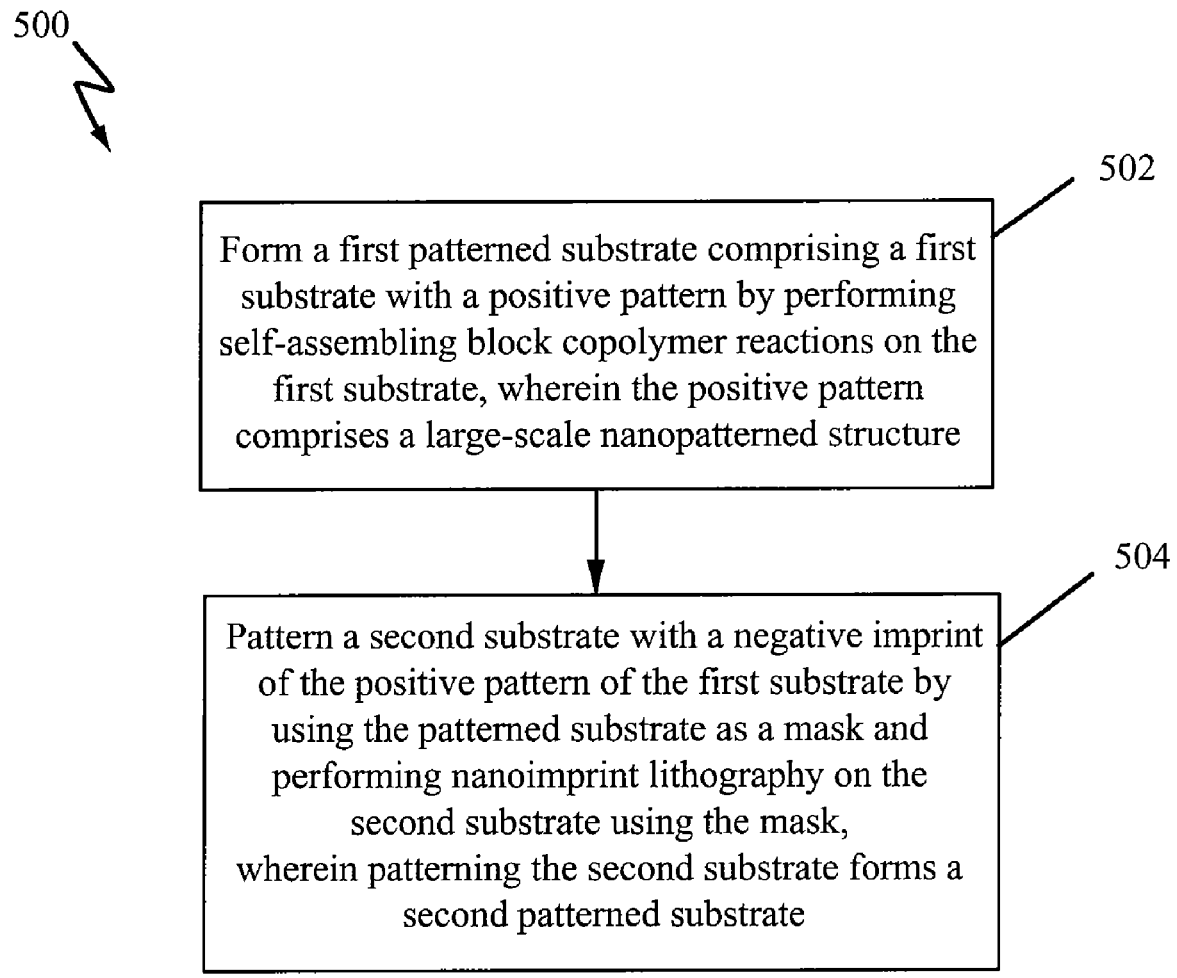
FIG. 5 illustrates a flow diagram of a method for replicating large-scale nano-pattern structures, in accordance with some examples.

The present disclosure generally relates to techniques, systems and methods for replicating large-scale nano-pattern structures. FIG. 5 illustrates a flow diagram of a method for replicating large-scale nano-pattern structures, in accordance with some examples. As shown in FIG. 5, in some examples, the method 500 may include forming a first patterned substrate comprising a first substrate with a positive pattern by performing self-assembling block copolymer reactions on the first substrate, wherein the positive pattern comprises a large-scale nano-patterned structure at operation 502; and patterning a second substrate with a negative imprint of the positive pattern of the first substrate by using the patterned substrate with a negative imprint of the positive pattern of the first substrate by using the patterned substrate as a mask and performing nano-imprint lithography on the second substrate using the mask, wherein patterning the second substrate forms a second patterned substrate at operation 504.

In various implementations, the performing self-assembling block copolymer reactions may comprise: at least partially coating a surface of the first substrate with a solution to form a block copolymer; placing a plate over the surface; moving the plate across the surface of the first substrate such that the block copolymer film self-organizes at a receding edge of the plate to form a pre-patterned substrate; and annealing the pre-patterned substrate to form the patterned substrate. The solution may be a diblock copolymer solution. The diblock copolymer solution may be a polystyrene-block-poly(methyl methacrylate) dissolved in toluene. The annealing may be performed at approximately 190° C. The imprint resist may be a polymer. The first substrate may be silicon. The patterned structure may be used as a mask in performing an other nano-imprint lithography to create a substrate with a positive pattern imprint. The other nano-imprint lithography may be performed by roll-to-roll nano-imprint lithography, or roll-on nano-imprint lithography.

In various implementations, the performing nano-imprint lithography may comprise at least partially coating a surface of the second substrate with an imprint resist material; pressing the mask to the imprint resist material to create a temporary combined unit; curing the temporary combined unit; and removing the mask. Curing may be performed by heat or by ultraviolet light. The second substrate may be silicon.

Figure 6:
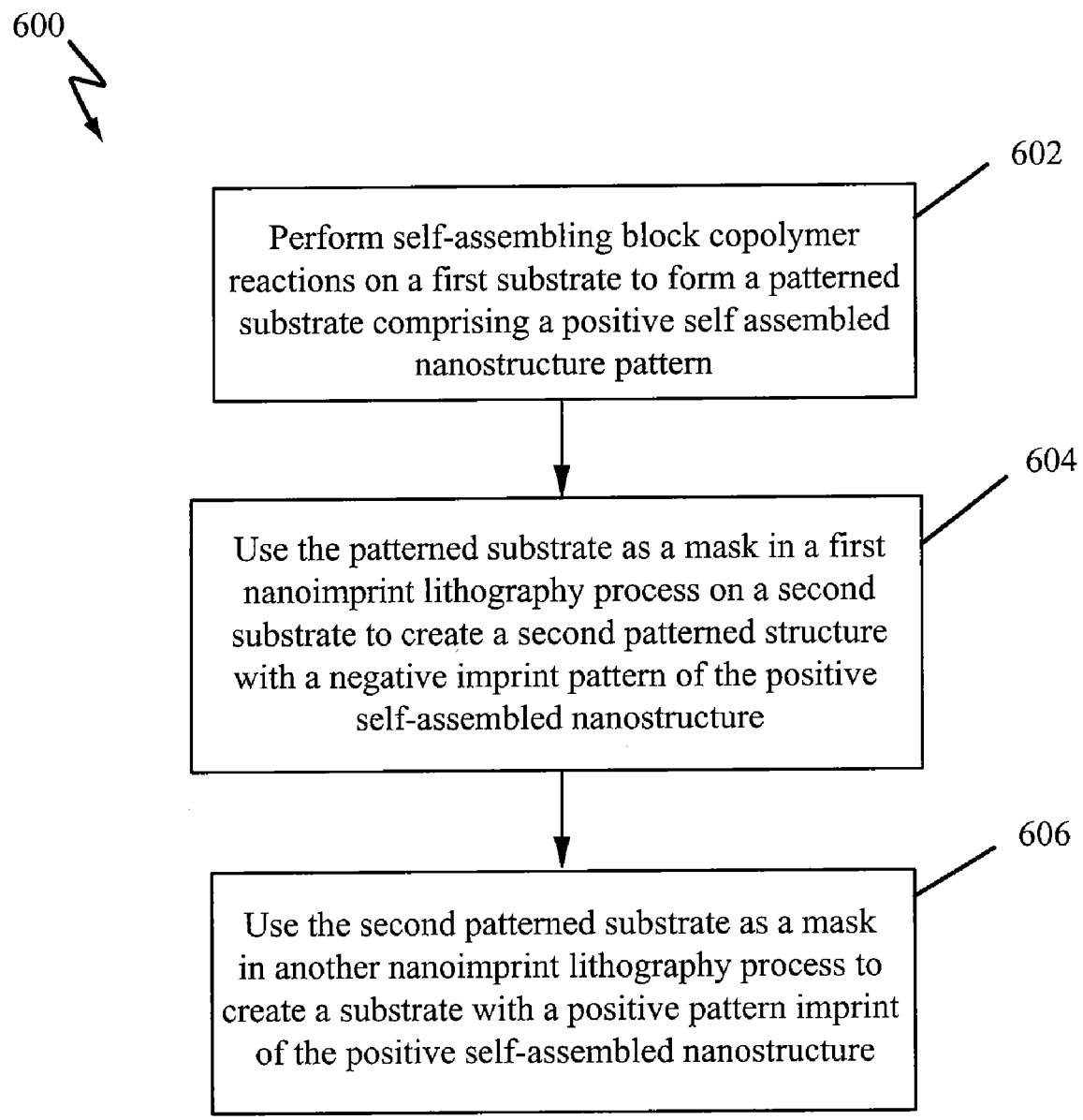
FIG. 6 illustrates a flow diagram of a method for replicating positive image imprints of large-scale nano-pattern structures, in accordance with some examples, all arranged in accordance with the present disclosure.

The present disclosure generally relates to systems and methods for replicating positive image imprints of large-scale nano-pattern structures. As shown in FIG. 6, in some examples, the method 600 may include performing self-assembling block copolymer reactions on a first substrate to form a patterned substrate comprising a positive self-assembled nano-structure pattern at operation 602; using the patterned substrate as a mask in a first nano-imprint lithography process on a second substrate to create a second patterned substrate with a negative imprint pattern of the positive self-assembled nano-structure at operation 604; using the second patterned substrate as a mask in an other nano-imprint lithography process to create a substrate with a positive pattern imprint of the positive self-assembled nano-structure at operation 606.

In various implementations, the other nano-imprint lithography process may be a roll-to-roll nano-imprint lithography process, or a roll-on nano-imprint lithography process. The positive self-assembled nano-structure pattern may be a diffuser pattern for a liquid crystal display screen. The positive self-assembled nano-structure pattern may be a speckle-reduction pattern for projection displays using laser light sources.

In various implementations, performing self-assembling block copolymer reactions may comprise at least partially coating a surface of the first substrate with a solution to form a block copolymer film; placing a plate over the surface; moving the plate across the surface of the first substrate such that the block copolymer film self-organizes at a receding edge of the plate to form a pre-patterned; and annealing the pre-patterned substrate to form the patterned substrate.

In various implementations, performing nano-imprint lithography may comprise at least partially coating a surface of the second substrate with an imprint resist material; pressing the mask to the imprint resist material to create a temporary combined unit; curing the temporary combined unit; and removing the mask.

The present disclosure generally may relate to a combined unit for use in replicating large-scale nano-pattern structures which may include a first patterned substrate including a pattern on a surface thereof, wherein the pattern is achieved through block copolymer reactions comprising: at least partially coating a surface of a first substrate with a solution to form a block copolymer film on the surface; placing a plate over the surface; moving the plate across the surface of the first substrate such that that block copolymer film self-organizes at a receding edge of the plate to form a pre-patterned substrate; and annealing the pre-patterned substrate to form the patterned substrate; and a second substrate having a surface at least partially coated with an imprint resist material, wherein the pattern on the surface of the first patterned substrate is pressed to the at least partially coated surface of the second substrate.

The present disclosure is not to be limited in terms of the particular embodiments described in this application, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range may be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," "greater than," "less than," and the like include the number recited and refer to ranges which may be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for replicating large-scale nano-pattern structures, comprising:
forming a first patterned substrate comprising a first substrate with a positive pattern by performing self-assembling block copolymer reactions on the first substrate, wherein the positive pattern comprises a large-scale nano-patterned structure including block copolymer structures; and patterning a second substrate with a negative imprint of the positive pattern of the first substrate by at least partially coating a surface of the second substrate with the coating, wherein the coating comprises an imprint resist material, pressing the first patterned substrate including the block copolymer structures into a coating on the second substrate to form a negative pattern, wherein pressing the first patterned substrate including the block copolymer structures into a coating on the second substrate forms a temporary combined unit, and transferring the negative pattern to the second substrate to form a second patterned substrate by curing the temporary combined unit and removing the first patterned substrate.

2. The method of claim 1, wherein the performing self-assembling block copolymer reactions comprises:
   at least partially coating a surface of the first substrate with a solution to form a block copolymer film;
   placing a plate over the surface;
   moving the plate across the surface of the first substrate such that the block copolymer film self-organizes at a receding edge of the plate to form a pre-patterned substrate; and
   annealing the pre-patterned substrate to form the patterned substrate.

3. The method of claim 2, wherein the solution comprises a diblock copolymer solution.

4. The method of claim 3, wherein the diblock copolymer solution comprises polystyrene-block-poly(methyl methacrylate) dissolved in toluene.

5. The method of claim 2, wherein the annealing is performed at approximately 190° C.

6. The method of claim 1, wherein the curing is performed by heat or by ultraviolet light.

7. The method of claim 1, wherein the second substrate comprises silicon.

8. The method of claim 3, wherein the imprint resist comprises a polymer.

9. The method of claim 1, wherein the first substrate comprises silicon.

10. The method of claim 1, further comprising using the second patterned substrate as a mask in performing an other nano-imprint lithography to create a third patterned substrate with a positive pattern imprint.

11. The method of claim 10, wherein the an other nano-imprint lithography is performed by roll-to-roll or roll-on nano-imprint lithography.

12. A method for replicating positive image imprints of large-scale nano-pattern structures, comprising:
   performing self-assembling block copolymer reactions on a first substrate to form a first patterned substrate comprising a positive self-assembled nano-structure pattern including block copolymer structures;
   pressing the first patterned substrate including the block copolymer structures into a coating on a second substrate to create a negative pattern by at least partially coating a surface of the second substrate with the coating comprising an imprint resist material, wherein pressing the first patterned substrate into the coating creates a temporary combined unit;
   transferring the negative pattern to the second substrate to form a second patterned substrate with a negative imprint pattern of the positive self-assembled nano-structure by curing the temporary combined unit and removing the second patterned substrate; and
   using the second patterned substrate as a mask in a nano-imprint lithography process to create a substrate with a positive pattern imprint of the positive self-assembled nano-structure.

13. The method of claim 12, wherein the nano-imprint lithography process is a roll-to-roll or a roll-on nano-imprint lithography process.

14. The method of claim 12, wherein the positive self-assembled nano-structure pattern comprises a diffuser pattern for a liquid crystal display screen.

15. The method of claim 12, wherein the positive self-assembled nano-structure pattern comprises a speckle-reduction pattern for projection displays using laser light sources.

16. The method of claim 12, wherein the performing self-assembling block copolymer reactions comprises:
   at least partially coating a surface of the first substrate with a solution to form a block copolymer film;
   placing a plate over the surface;
   moving the plate across the surface of the first substrate such that the block copolymer film self-organizes at a receding edge of the plate to form a pre-patterned substrate; and
   annealing the pre-patterned substrate to form the patterned substrate.

17. A combined unit for use in replicating large-scale nano-pattern structures, comprising:
   a first patterned substrate including a pattern on a surface thereof, wherein the pattern includes block copolymer structures, and wherein the pattern is achieved through block copolymer reactions comprising:
      at least partially coating a surface of a first substrate with a solution to form a block copolymer film on the surface;
      placing a plate over the surface;
      moving the plate across the surface of the first substrate such that the block copolymer film self-organizes at a receding edge of the plate to form a pre-patterned substrate; and
      annealing the pre-patterned substrate to form the patterned substrate; and
   a second substrate having a surface at least partially coated with an imprint resist material, wherein the pattern on the surface of the first patterned substrate, including the block copolymer structures, is pressed into the at least partially coated surface of the second substrate.

* * * * *

UNITED STATES PATENT AND TRADEMARK OFFICE
CERTIFICATE OF CORRECTION

| | | |
|---|---|---|
| PATENT NO. | : 8,178,011 B2 | Page 1 of 1 |
| APPLICATION NO. | : 12/511457 | |
| DATED | : May 15, 2012 | |
| INVENTOR(S) | : Kruglick | |

It is certified that error appears in the above-identified patent and that said Letters Patent is hereby corrected as shown below:

On the Title Page, in Figure, for Tag "26", in Line 3, delete "to from" and insert -- to form --, therefor.

In Fig. 1A, Sheet 1 of 8, for Tag "26", in Line 3, delete "to from" and insert -- to form --, therefor.

In Column 1, Line 62, delete "FIG. 3b," and insert -- FIG. 3b --, therefor.

In Column 2, Line 6, delete "examples;" and insert -- examples; and --, therefor.

In Column 15, Line 50, in Claim 11, delete "the an" and insert -- the --, therefor.

Signed and Sealed this
Thirty-first Day of July, 2012

David J. Kappos
*Director of the United States Patent and Trademark Office*